(12) United States Patent
Castro et al.

(10) Patent No.: US 8,320,172 B2
(45) Date of Patent: Nov. 27, 2012

(54) WRITE OPERATION FOR PHASE CHANGE MEMORY

(75) Inventors: Hernan A. Castro, Shingle Springs, CA (US); Jeremy Hirst, Orangevale, CA (US); Stephen Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/846,775

(22) Filed: Jul. 29, 2010

(65) Prior Publication Data
US 2012/0026786 A1 Feb. 2, 2012

(51) Int. Cl.
*G11C 11/50* (2006.01)

(52) U.S. Cl. ......... 365/163; 365/148; 365/149; 365/204
(58) Field of Classification Search ............... 365/163, 365/148, 149, 204
See application file for complete search history.

(56) References Cited

U.S. PATENT DOCUMENTS

| | | | |
|---|---|---|---|
| 2006/0233019 A1* | 10/2006 | Kostylev et al. | 365/163 |
| 2009/0116280 A1* | 5/2009 | Parkinson et al. | 365/163 |
| 2011/0149628 A1* | 6/2011 | Langtry et al. | 365/51 |

* cited by examiner

*Primary Examiner* — Toan Le
(74) *Attorney, Agent, or Firm* — Knobbe Martens Olson & Bear LLP

(57) ABSTRACT

Embodiments disclosed herein may relate to controlling a discharge of a capacitive element coupled to a phase change memory cell to produce a specified state in the phase change memory cell.

25 Claims, 6 Drawing Sheets

WRITE OPERATION FOR PHASE CHANGE MEMORY

BACKGROUND

Subject matter disclosed herein relates to phase change memory devices, and may relate more particularly to write pulses for phase change memory devices.

Integrated circuit devices, such as non-volatile memory devices, for example, may be found in a wide range of electronic devices. For example, non-volatile memory devices may be used in computers, digital cameras, cellular telephones, personal digital assistants, etc. Phase change memory represents an example type of non-volatile memory device. Phase change memory devices may be characterized at least in part by how information is stored in individual memory cells in that a state of a particular memory cell depends on a state of the memory cell material. An amorphous, non-crystalline state may represents a binary value of '0', also referred to as a "reset" state, and a crystalline state of the memory cell may represent a binary value of '1', also referred to as a "set" state. In a phase change memory, whether a memory cell is set or reset may depend, at least in part on a magnitude and shape of a current pulse applied to the memory cell.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
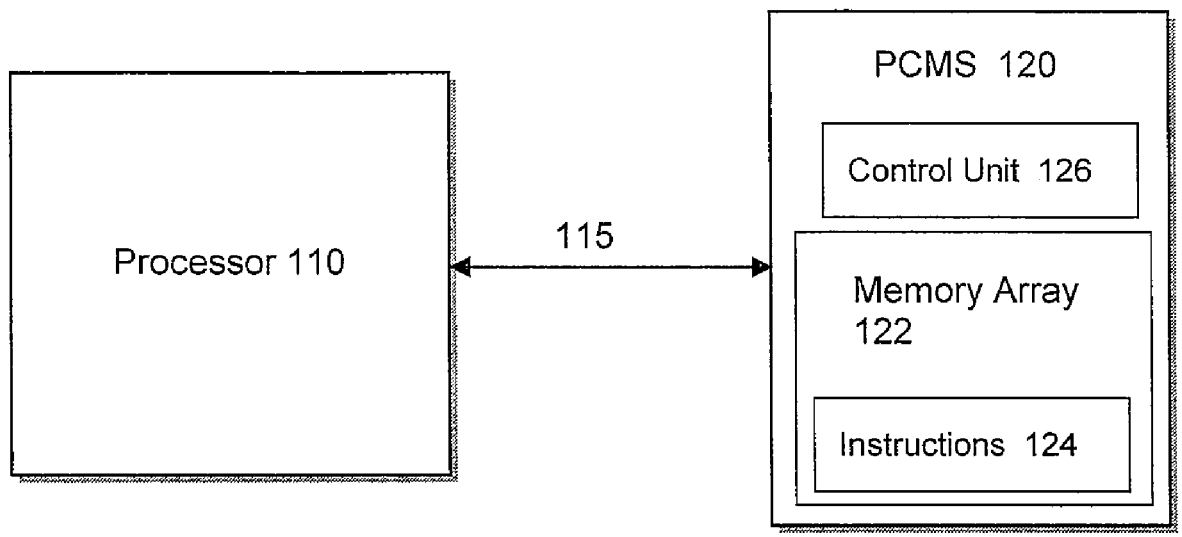
FIG. 1 is a schematic block diagram depicting an example embodiment of a system including an example embodiment of a phase change memory device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict the application of claimed subject matter. Therefore, the following detailed description is not to be taken to limit the scope of claimed subject matter or their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, integrated circuit devices, such as non-volatile memory devices, for example, may be found in a wide range of electronic devices. For example, Phase Change Memory (PCM) or Phase Change Memory with Selector (PCMS) non-volatile memory devices may be used in computers, digital cameras, cellular telephones, personal digital assistants, etc. For PCM and PCMS memory devices, a state of a particular memory cell may depend on a phase of the memory cell material, as discussed below, for example. A PCMS memory device may be differentiated from a PCM memory device by an array of switches fabricated out of material similar to that of the memory cells, in one or more embodiments. Such switches may also be referred to as selectors, in an embodiment. An array of selectors may serve to isolate individual memory cells in an array of memory cells. By contrast, a PCM memory device may include switches or selectors comprising bi-polar devices formed in a CMOS layer.

Also, for PCM and PCMS memory devices, a memory cell may comprise chalcogenide glass, in an embodiment. A PCM or PCMS memory cell may be made to switch between different states with an application of sufficient heat. For example, a "set" state, representing a binary value of '1', in an embodiment, may correspond to a substantially crystalline, substantially conductive state for a material of a memory cell. A "reset" state, on the other hand, representing a binary value of '0', in an embodiment, may correspond to a substantially amorphous, relatively resistive state of a memory cell. In a PCM or PCMS memory, heat sufficient to change the phase of a memory cell may be achieved by application of a current pulse to the memory cell. Characteristics of the applied current pulse may determine which particular state is reflected in the memory cell. As used herein, the term "substantially amorphous state" refers to a state of memory cell material characterized at least in part by relatively high resistivity. Also as used herein, the term "substantially crystalline state" refers to a state of memory cell material characterized at least in part by relatively high conductivity. In an embodiment, a level of conductivity of a memory cell in a substantially crystalline state may be at least an order of magnitude greater than a level of conductivity of the memory cell in a substantially amorphous state. However, the scope of claimed subject matter is not limited in this respect.

In an embodiment, a write operation to a PCMS memory cell may utilize a level of current large enough to melt memory cell material. As noted previously, for an embodiment a PCMS memory cell may comprise chalcogenide glass. In a write operation, sufficient current to melt the memory cell material may be applied, and a rate at which the cell material cools down to a solid may determine whether the write operation results in a set state or a reset state for the memory cell. A rate of cooling may depend at least in part on a magnitude or shape of a current pulse applied to a memory cell. Example set and reset pulses are discussed more fully below, for example in connection with FIGS. 3 and 4.

FIG. 1 is a schematic block diagram depicting an example embodiment of a system 100 including an example embodiment of a PCMS memory device 120. In an embodiment, PCMS 120 may comprise an array of memory cells 122 that may be implemented in accordance with one or more embodiments disclosed herein. PCMS 120 may be coupled in an embodiment to a processor 110 by way of an interconnect 115. System 100 is presented in FIG. 1 at least in part in order to provide one potential context for a phase change memory device, and embodiments in accordance with claimed subject matter are not limited to the example depicted in FIG. 1.

PCMS 120 in an embodiment may comprise a control unit 126, as well as memory array 122. Memory array 122 for an embodiment may comprise an array of PCMS memory cells. Further, array 122 may be implemented as a cross-point array of PCMS memory cells, in an embodiment. Also in an embodiment, memory array 122 may store instructions 124 that may include one or more applications which are executable by processor 110. In an embodiment, processor 110 may transmit a memory access command to PCMS 120. Control unit 126 may, for an embodiment, access one or more memory cells of memory array 122 at least in part in response to receiving the memory access command from processor 110. In an embodiment, a memory access command may comprise a memory write command. An example memory write command may comprise setting or resetting one or more memory cells of memory array 122. Example embodiments described more fully below may be utilized to affect particular states for particular memory cells in accordance with a memory write command delivered to PCMS 120 by processor 110, in an embodiment.

In an embodiment, system 100 may comprise a computing platform. A computing platform may comprise a system or a device that includes an ability to process or store data in the form of signals. Thus, a computing platform, in this context, may comprise hardware, software, firmware or any combination thereof. Computing platform 100, as depicted in FIG. 1, is merely one such example, and the scope of claimed subject matter is not limited in these respects. For one or more embodiments, a computing platform may comprise any of a wide range of digital electronic devices including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform.

Figure 2:
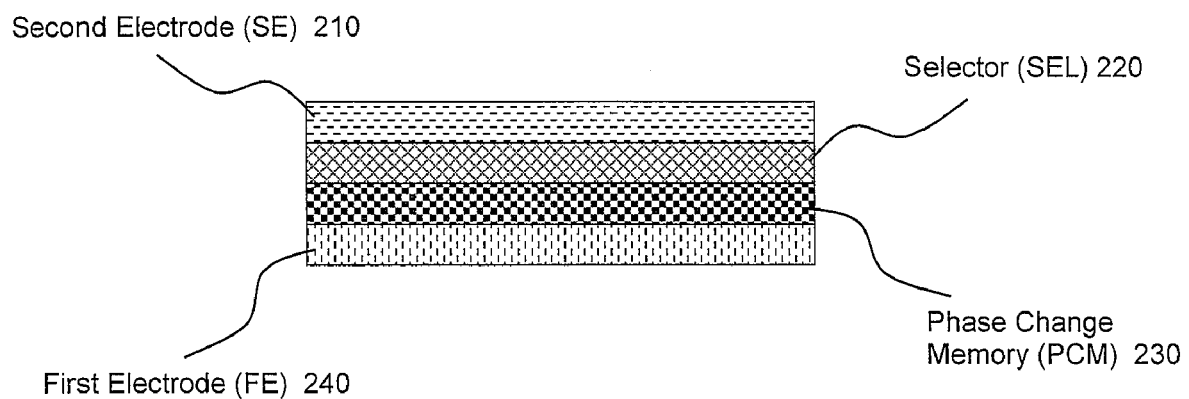
FIG. 2 is an illustration depicting a cross-sectional view of an example embodiment of a phase change memory with a selector.

FIG. 2 is an illustration depicting a cross-sectional view of an example embodiment of memory array 122 for PCMS 120. For the present example embodiment, PCMS array 122 may be implemented as a cross-point memory array. In a PCMS cross-point memory array, two layers of orthogonal electrically conductive lines may be formed, with one layer of electrically conductive lines formed at the bottom of a memory stack and another layer of electrically conductive lines running in an orthogonal direction formed in a top layer of the memory stack. In an embodiment, the bottom layer of electrically conductive lines may be referred to as a first electrode (FE) layer 240, and the top layer of electrically conductive lines may be referred to a second electrode (SE) layer 210. Also for an embodiment, and as depicted in FIG. 2, a layer of PCM memory cells (230) and a layer of selector devices (SEL) 220 may be located between layers FE 140 and SE 110 to form PCMS memory array 122. However, PCMS array 122 depicted in FIG. 2 is merely an example, and claimed subject matter is not limited in scope in these respects. Further, it should also be noted that directions or references, for example, up, down, top, bottom, and so on, may be used to facilitate discussion of the Figures, and the scope of claimed subject matter is not limited in these respects.

Figure 3:
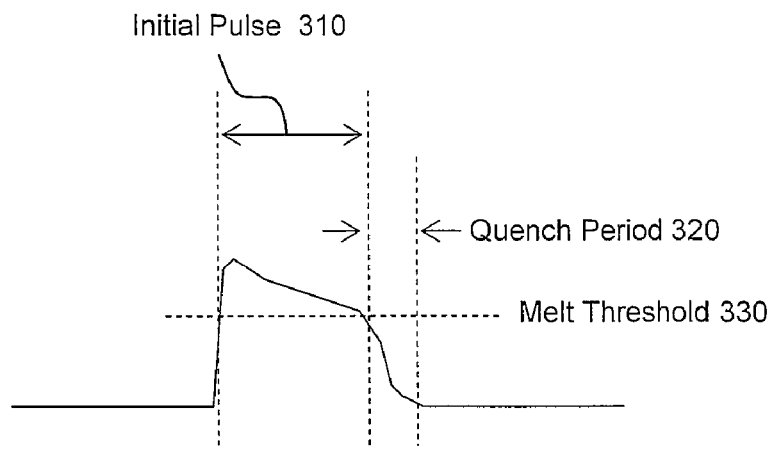
FIG. 3 is an illustration of an example waveform depicting a current applied to an example embodiment of a phase change memory cell to produce a reset state in the phase change memory cell.

FIG. 3 is an illustration of an example waveform 300 depicting a current pulse that may be applied to an example embodiment of a phase change memory cell to produce a reset state in the phase change memory cell. In an embodiment, to melt the memory cell material, an initial pulse 310 with a magnitude that exceeds a melt threshold 330 may be applied to and may flow through the memory cell material. As used herein, the term "melt threshold" refers to an approximate minimum level of current sufficient to melt a phase change memory cell material to achieve a liquid state. In an example embodiment, melt threshold 330 may comprise a value of approximately 1.2 mA. Also, for an embodiment, initial pulse 310 may have a level of approximately 2.0 mA. Initial pulse 310 may further have a duration of approximately 6.0 ns, and a quench period 320 may have a duration of approximately 2.0 ns. However, these are merely examples of current levels or durations that may result in an amorphous state in a memory cell, and the scope of claimed subject matter is not limited in these respects.

As used herein, the term "quenching period" may refer to an amount of time for a level of current flowing through a memory cell to fall from a melt threshold to a level of substantially no current. For reset pulse 300, enough current to melt the material of a memory cell may be applied to the memory cell during initial pulse period 310, followed by a relatively abrupt falling of the current level to produce a relatively brief quench period 320. For an example, an applied current pulse may take an approximate shape of a square pulse. A relatively square waveform may be a characteristic of a reset pulse, in an example embodiment. In an embodiment, a reset pulse may be characterized, at least in part, by an initial current pulse of sufficient magnitude or duration to melt a memory cell material, followed by a relatively abrupt falling of the current level to allow for a relatively quick cooling of the memory cell material. A relatively quick cooling of the memory cell material may not allow for substantial formation of a crystalline structure within the memory cell material, but rather an amorphous state for the memory cell material may result. As noted previously, in an example embodiment, an amorphous state of a memory cell may represent a binary value of '0', although the scope of claimed subject matter is not limited in this respect. As used herein, the term "relatively brief quenching period" refers to a relatively abrupt falling of a current level resulting in a relatively quick cooling of a memory cell material and resulting in a substantially amorphous state in the memory cell material.

Figure 4:
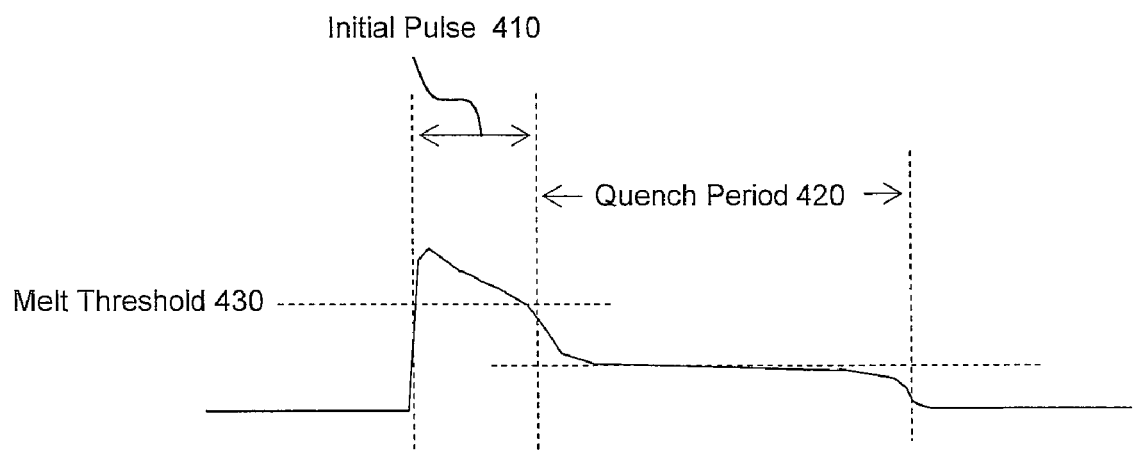
FIG. 4 is an illustration of an example waveform depicting a current applied to an example embodiment of a phase change memory cell to produce a set state in the phase change memory cell.

FIG. 4 is an illustration of an example waveform 400 depicting a current applied to an example embodiment of a phase change memory cell to produce a set state in the phase change memory cell. In an embodiment, to melt the memory cell material, an initial pulse 410 with a magnitude that exceeds a melt threshold 430 may be applied to and may flow through the memory cell material. In an example embodiment, melt threshold 430 may comprise a value of approximately 1.2 mA. Also, for an embodiment, initial pulse 410 may have a level of approximately 2.0 mA. Initial pulse 410 may further have a duration of approximately 6.0 ns, and a quench period 420 may have a duration of approximately 200.0 ns. However, these are merely examples of current levels and durations, and the scope of claimed subject matter is not limited in these respects.

In an embodiment, for set pulse 400, enough current to melt the material of a memory cell may be applied to the memory cell during initial pulse period 410, followed by a relatively extended falling of the current level during quench period 420. In an embodiment, a set pulse may be characterized, at least in part, by an initial current pulse of sufficient magnitude or duration to melt a memory cell material, followed by a relatively slow falling of the current level to allow for a relatively slow cooling of the memory cell material. In an embodiment, during quench period 420, the current flowing through the memory cell may have a level of approximately 825.0 µA, for example, although the scope of claimed subject matter is not limited in this respect. A relatively slow cooling of the memory cell material may allow for substantial formation of a crystalline structure within the memory cell material, and a substantially crystalline state for the memory cell material may result. As noted previously, in an example embodiment, a crystalline state of a memory cell may represent a binary value of '1', although the scope of claimed subject matter is not limited in this respect.

Figure 5:
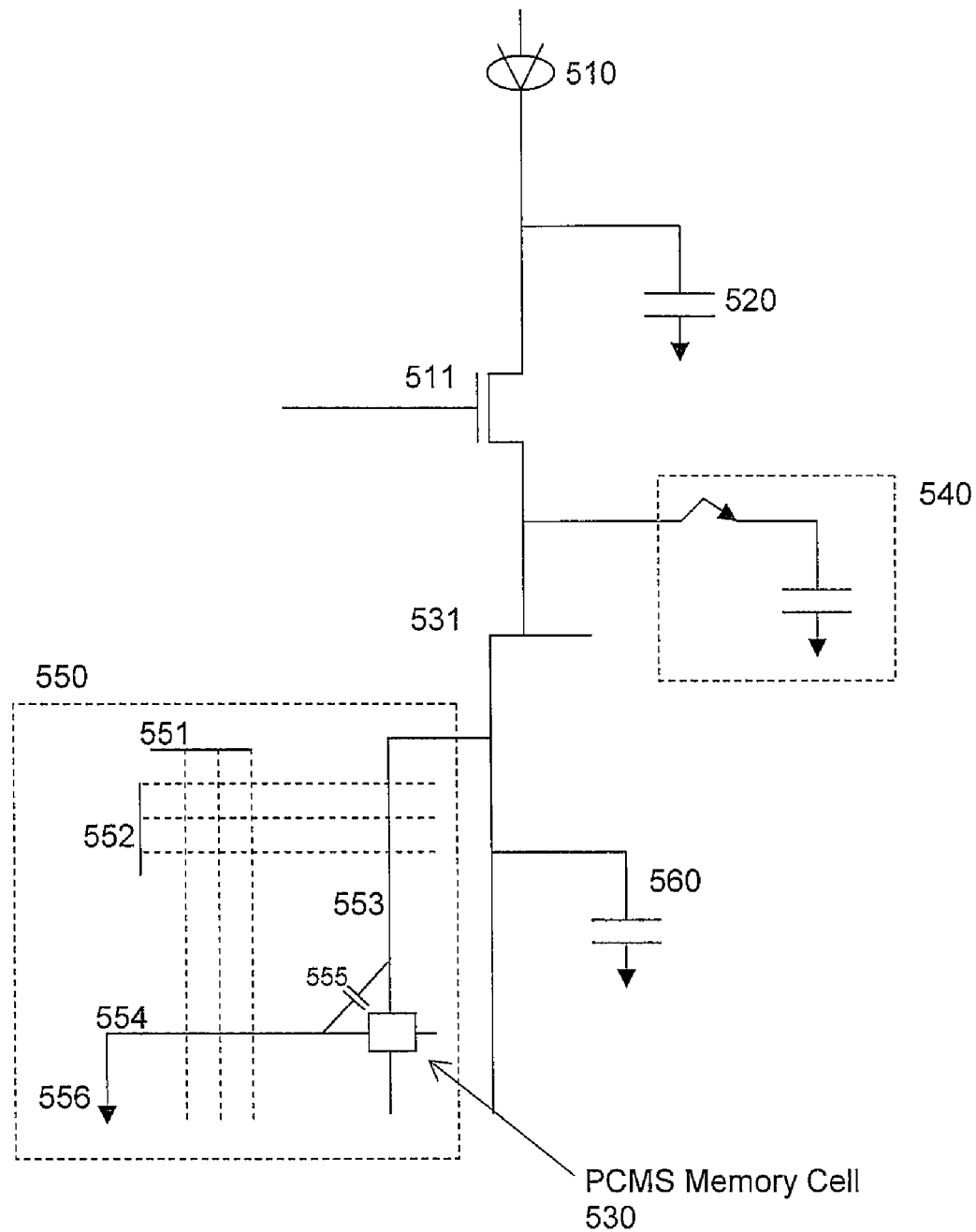
FIG. 5 is a schematic diagram of an example embodiment of a phase change memory cell and associated circuitry.

FIG. 5 is a schematic diagram of an example embodiment of a phase change memory including a phase change memory cell 530 and associated circuitry 500. For the example of FIG. 5, single memory cell 530 is depicted, as is a current source 510. In an embodiment, at least in part in response to a write command for memory cell 530, a capacitor 520 may be charged. Capacitor 520 may comprise an explicitly designed or implemented capacitor, or may comprise a parasitic capacitance, for example. To charge capacitor 520, a voltage or current may be applied by a source 510 during pre-charge period. A switch 511 may be turned on, thereby selecting memory cell 530, and current discharged from capacitor 520 may be directed through memory cell 530, thereby melting the memory cell. Control of a termination phase of the current pulse may be achieved through a wide range of techniques. In an embodiment, current may flow from global bit line 531 through a cross-point array 550 comprising a plurality of word-lines 552 and bit-lines 551 and through memory cell 530 to a ground node 556. A selected bit-line 553 and a selected word-line 554 are depicted. In an embodiment, selected bit-line 553 and selected word-line 554 may provide an electrically conductive path to ground node 556 through memory cell 530.

A rate at which capacitor 520 may discharge may depend, at least in part, on characteristics of capacitor 520 or upon other capacitive components. For example, parasitic capacitances may exist at one or more locations in circuit 500. One example of a parasitic capacitance is depicted between selected word-line 554 and selected bit-line 553, labeled as parasitic capacitance 555. A capacitor 560 is also depicted on global bit-line 531. Capacitor 560 may comprise an expressly designed and implemented capacitor in an embodiment, or may comprise a parasitic capacitance in another embodiment. In a further embodiment, capacitor 560 may comprise a combination of an expressly designed capacitor and a parasitic capacitance.

In an embodiment, circuitry 500 may comprise fixed capacitive components comprising, for example, capacitor 560, and parasitic capacitance 555. Fixed capacitive components may determine, at least in part, a rate of discharge of capacitor 520 through memory cell 520. In addition to fixed capacitive components, circuitry 500 may comprise a circuit-controlled capacitor 540 that may be selectively coupled to memory cell 530. In an embodiment, by applying additional capacitance, a rate of discharge of capacitor 520 may be slowed as compared to a situation without the additional capacitance. In this manner, a desired current pulse shape may be obtained to produce a desired state in memory cell 530. For example, if a write command indicates that a value of '0' is to be written to memory cell 530, capacitor 540 may not be applied to memory cell 530, or may be applied for a relatively short period of time, thereby allowing capacitor 520 to discharge through memory cell 530 to ground node 556. With capacitor 540 not engaged in the circuit, the quenching period may be relatively short. As previously discussed, a relatively short quenching period may not allow a substantially crystalline structure to form in memory cell 530, and a substantially amorphous state may result. As also previously mentioned, an amorphous state in a memory cell may indicate a value of '0', although the scope of claimed subject matter is not limited in this respect.

If a write command indicates that a value of '1' is to be written to memory cell 530, capacitor 540 may be applied to memory cell 530. Timing parameters or other characteristics for capacitor 540 may be programmable, in an embodiment, so that desired current pulses may be achieved. Capacitance provided by capacitor 540 may allow for a relatively extended quenching period, perhaps approximately 200.0 ns in an example embodiment, although the scope of claimed subject matter is not limited in this respect. As noted previously, a relatively long quenching period may allow for a formation of a substantially crystalline structure in memory cell 530. As also mentioned previously, for an embodiment, a crystalline state may indicate a value of 1', although again, the scope of claimed subject matter is not limited in this respect.

Figure 6:
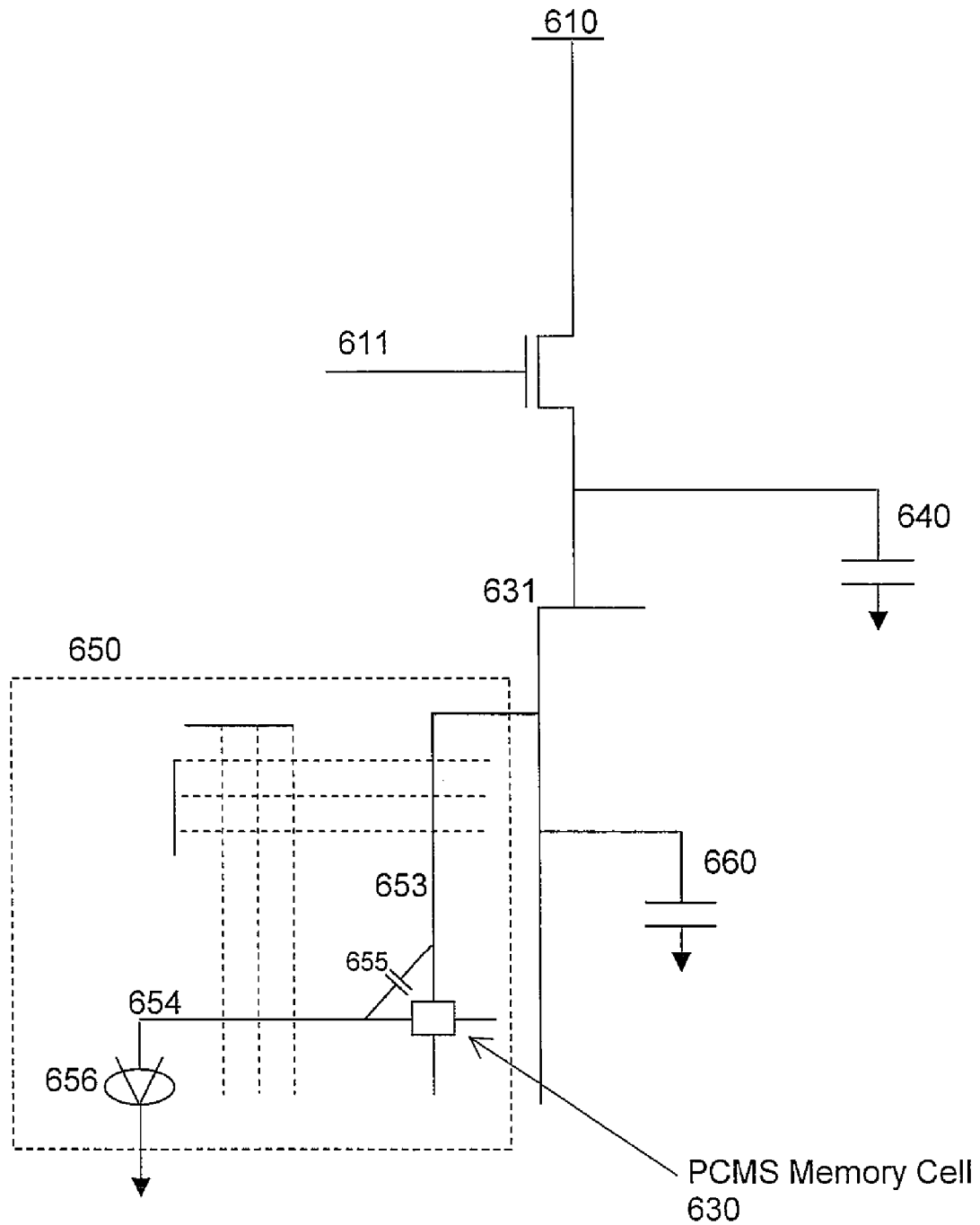
FIG. 6 is a schematic diagram of an example embodiment of a phase change memory cell and associated circuitry.

FIG. 6 is a schematic diagram depicting an example circuit 600 including a PCM memory cell 630. In an embodiment, discharge of current from a capacitor through memory cell 630 may be controlled through a current mirror or other current limiting circuit 656 in a word line decoder path, for example. In FIG. 6, selected bit line 653 and selected word-line 654 of a cross-point array 650 may couple current limiter circuit 656 to memory cell 630, in an embodiment. Also, in an embodiment, a capacitor 640 may be charged upon selection of memory cell 630 by a switch 611. Capacitor 640, in an embodiment, may comprise an explicitly designed or implemented capacitor, or may comprise a parasitic capacitance or other capacitance inherent to one or more circuit features. Discharge of capacitor 640 may be controlled, as described above, by way of current limiting circuitry 656, in an example embodiment. For another example, discharge of capacitor 640 may be allowed to occur according to resistive or capacitive characteristics inherent in memory circuit 600, represented in FIG. 6 by capacitor 660, to achieve an extended quenching period in the case of a set pulse. For a reset pulse, where a more abrupt termination of pulse may be desired, memory cell 630 may be deselected at switch 611 to provide sharp cut-off of current from a source 610 to memory cell 630.

Example embodiments such as those described above may provide a relatively simple circuit for providing set or reset current pulses to phase change memory cells. Such embodiments in accordance with claimed subject matter may consume reduced amounts of power due, at least in part, to relatively simple implementations. Additionally, reduced power consumption may allow for an increase in an amount of parallel write pulses, thereby resulting in potential performance improvements. Of course, these are merely example potential advantages, and the scope of claimed subject matter is not limited in this respect.

Figure 7:
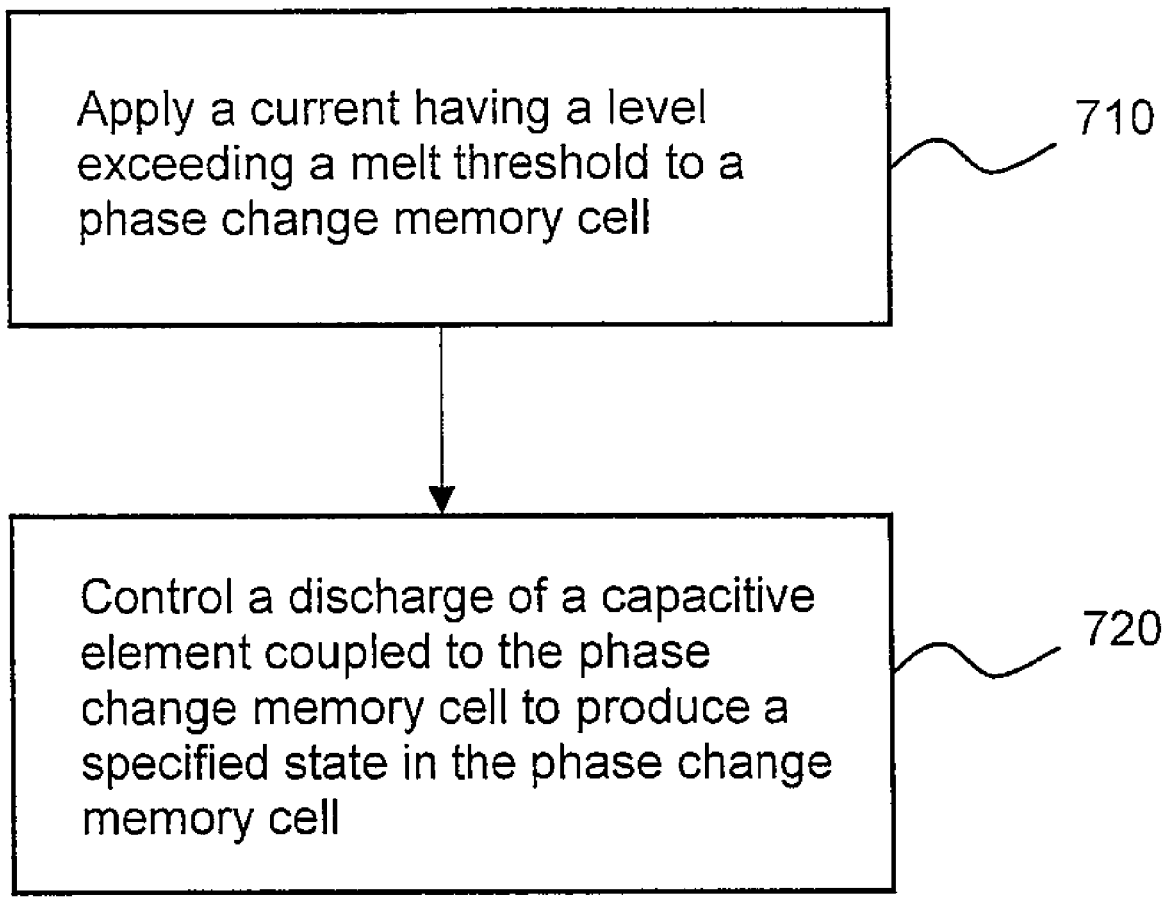
FIG. 7 is a flow diagram illustrating an example embodiment of a process for controlling a discharge of current through a phase change memory cell.

FIG. 7 is a flow diagram illustrating an example embodiment of a process for controlling a discharge of current through a phase change memory cell. At block 710, a current having a level exceeding a melt threshold may be applied to a phase change memory cell. At block 720, a discharge of a capacitive element coupled to the phase change memory cell may be controlled to produce a specified state in the phase change memory cell. As previously described, example embodiments for controlling a discharge of a capacitive element to allow a specified state of a memory cell to result may include current limiting techniques, in one or more embodiments. Other embodiments may utilize circuit-controlled capacitors to control a discharge of a capacitor to produce appropriate current pulses. In general, to produce a set state in a PCM memory cell, a quenching period for a current pulse through the memory cell may be relatively extended as compared to a quenching period for a current pulse suitable to produce a reset state. For a set pulse, a relatively extended quenching period may allow for a formation of a substantially crystalline, electrically conductive state in a memory cell. For a reset pulse, a relatively abrupt quenching period may not allow for a formation of a crystalline structure, and an amorphous, relatively non-electrically conductive state may result in the memory cell. Embodiments in accordance with claimed subject matter may include all of, more than, or less than blocks 710-720. Further, the order of blocks 710-720 is merely an example order. Also, although specific example embodiments for controlling discharge of a capacitive element to produce current pulses appropriate for the formation of specified set or reset states in phase change memory cells have been described, the scope of claimed subject matter is not limited in these respects.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and" and "or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. A method, comprising:
controlling a plurality of capacitive elements to apply currents having a plurality of level thresholds to a phase change memory cell; and
coupling the plurality of capacitive elements to the phase change memory cell to produce a current pulse of a specified programmable shape in the phase change memory cell.

2. The method of claim 1, wherein the controlling a plurality of capacitive elements comprises drawing a current pulse exceeding a melt threshold of the phase change memory cell from one or more of the plurality of capacitive elements.

3. The method of claim 2, wherein the melt threshold comprises a value of approximately 1.2 mA.

4. The method of claim 1, wherein one or more of the plurality of capacitive elements comprises a parasitic capacitance.

5. The method of claim 1, wherein one or more of the plurality of capacitive elements comprises an explicitly designed capacitor.

6. The method of claim 1, wherein the coupling of the plurality of capacitive elements comprises substantially discharging one or more of the plurality of capacitive elements over a relatively brief period to produce a substantially amorphous state.

7. The method of claim 6, wherein the discharging occurs over a period of no more than approximately 2 ns.

8. The method of claim 1, wherein the coupling the one or more of the plurality of capacitive elements comprises substantially eliminating the current applied to the phase change memory cell over a relatively brief period to produce a substantially amorphous state at least in part by decoupling the one or more of the plurality of capacitive elements from the phase change memory cell.

9. The method of claim 1, wherein the coupling the one or more of the plurality of capacitive elements comprises discharging the one or more of the plurality of capacitive elements over a relatively extended period to produce a substantially crystalline state.

10. The method of claim 9, wherein the coupling the one or more of the plurality of capacitive elements comprises limiting a discharge current through the phase change memory cell to a level less than a melt threshold.

11. The method of claim 10, wherein the limiting the discharge current through the phase change memory cell comprises engaging a current limiter circuit coupled to a wordline decoder path.

12. The method of claim 9, wherein the discharging occurs over a period of no more than approximately 200 ns.

13. An apparatus, comprising:
a plurality of capacitive elements to apply currents having a plurality of level thresholds to a phase change memory cell; and
control circuitry to control coupling the plurality of capacitive elements to the phase change memory cell to produce a current pulse of a specified programmable shape in the phase change memory cell.

14. The apparatus of claim 13, wherein the current pulse of a specified programmable shape comprises a current pulse to exceed a melt threshold of a phase change memory cell.

15. The apparatus of claim 14, wherein applied currents are to be applied over a period of no more than approximately 6 ns.

16. The apparatus of claim 13, wherein one or more of the plurality of capacitive elements comprises a parasitic capacitance.

17. The apparatus of claim 13, wherein one or more of the plurality of capacitive elements comprises an explicitly designed capacitor.

18. The apparatus of claim 13, wherein the control circuitry is capable of controlling the one or more of the plurality of capacitive elements at least in part by substantially discharging the one or more of the plurality of capacitive elements over a relatively brief period to produce a substantially amorphous state.

19. The apparatus of claim 13, wherein the control circuitry is capable of controlling a discharge of the one or more of the plurality of capacitive elements at least in part by discharging the one or more of the plurality of capacitive elements over a relatively extended period to produce a substantially crystalline state.

20. The apparatus of claim 19, wherein the control circuitry comprises a current limiter capable of limiting a discharge current through the phase change memory cell to a level less than the melt threshold.

21. A system, comprising:
a processor; and
a non-volatile memory device coupled to the processor, the non-volatile memory device comprising
a plurality of capacitive elements to apply currents having plurality of level thresholds to a phase change memory cell; and
control circuitry to control coupling the plurality of capacitive elements to the phase change memory cell to produce a current pulse of a specified programmable shape in the phase change memory cell.

22. The system of claim 21, wherein the current pulse of a specific programmable shape comprises a current pulse to exceed a melt threshold of the phase change memory cell.

23. The system of claim 21, wherein the control circuitry is capable of controlling the plurality of capacitive elements at least in part by substantially discharging the plurality of capacitive elements over a relatively brief quenching period to produce a substantially amorphous state.

24. The system of claim 21, wherein the control circuitry is capable of controlling the plurality of capacitive elements at least in part by discharging the capacitive elements over a relatively extended period to produce a substantially crystalline state.

25. The apparatus of claim 24, wherein the discharging to occur over a period of no more than approximately 200 ns.

* * * * *